(12) United States Patent
Seauve (10) Patent No.: US 11,335,227 B2
(45) Date of Patent: May 17, 2022

(54) DISPLAY SYSTEM WITH VARIABLE RESOLUTION

(71) Applicant: COMMISSARIAT A L'ENERGIE ATOMIQUE ET AUX ENERGIES ALTERNATIVES, Paris (FR)

(72) Inventor: Yoann Seauve, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/747,856

(22) Filed: Jan. 21, 2020

(65) Prior Publication Data
US 2020/0234625 A1 Jul. 23, 2020

(30) Foreign Application Priority Data

Jan. 22, 2019 (FR) ..................................... 19 00539

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0426* (2013.01);
(Continued)

(58) Field of Classification Search
CPC ............ G09G 3/20; G09G 2300/0426; G09G 2310/0272; G09G 2310/0286;
(Continued)

(56) References Cited

U.S. PATENT DOCUMENTS 6,191,770 B1 2/2001 Kim
7,532,190 B2 5/2009 Lin et al.
(Continued)

FOREIGN PATENT DOCUMENTS

WO WO 2016/069088 A1 5/2016
WO WO 2018/035045 A1 2/2018

OTHER PUBLICATIONS

French Preliminary Search Report dated Sep. 4, 2019 in French Application 19 00539 filed Jan. 22, 2019 (with English Translation of Categories of Cited Documents), 2 pages.
(Continued)

*Primary Examiner* — Jeff Piziali
(74) *Attorney, Agent, or Firm* — Oblon, McClelland, Maier & Neustadt, L.L.P.

(57) ABSTRACT

Device for displaying images comprising: a line selector, the line selector and/or the column controller comprising a selection circuit comprising a succession of output channels corresponding to various rows of the matrix, said selection circuit further comprising a succession of shift registers and a succession of switches controlled by at least one configuration word for controlling the respective configurations of the succession of switches of said selection circuit and for placing the switches of said succession of switches respectively in one of said first configuration or second configuration according to the respective states of configuration bits of this configuration word, the first configuration allowing to propagate a signal in the succession of registers, the second configuration allowing to duplicate a signal emitted on the preceding output channel on the given output channel in order to consequently duplicate on a row corresponding to the given output channel a piece of data intended for a row corresponding to the preceding output channel.

11 Claims, 6 Drawing Sheets

(52) U.S. Cl.
CPC ............... *G09G 2310/0272* (2013.01); *G09G 2310/0286* (2013.01); *G09G 2340/04* (2013.01)

(58) Field of Classification Search
CPC ....... G09G 2340/04; G09G 2340/0421; G09G 2310/027; G09G 2310/0267; G09G 2340/0414; G11C 19/28
See application file for complete search history.

(56) References Cited

U.S. PATENT DOCUMENTS

| | | | |
|---|---|---|---|
| 8,519,925 B2 | 8/2013 | Phan | |
| 2008/0198126 A1* | 8/2008 | Yamashita | G09G 3/3688 345/99 |
| 2011/0199355 A1* | 8/2011 | Watanabe | G09G 3/3688 345/211 |
| 2016/0063957 A1* | 3/2016 | Shirasaki | G09G 3/20 345/213 |
| 2016/0147505 A1* | 5/2016 | Lee | G11C 19/28 327/164 |
| 2017/0236466 A1 | 8/2017 | Spitzer et al. | |
| 2019/0172399 A1* | 6/2019 | Chen | G09G 3/3677 |

OTHER PUBLICATIONS

Li, X. et al., "An Efficient Method for Eye Tracking and Eye-Gazed FOV Estimation," 2009 16th IEEE International Conference on Image Processing (ICIP), 2009, doi: 10.1109/ICIP.2009.5413997, pp. 2597-2600.

* cited by examiner

DISPLAY SYSTEM WITH VARIABLE RESOLUTION

TECHNICAL FIELD AND PRIOR ART

The present invention relates to the field of matrix display devices, also called screens.

In this field, it is generally sought to increase the resolution, the refresh rate, and the number of bits encoding a color displayed by each pixel, which requires transmitting to the screen a data flow that is more and more substantial.

However, for certain display devices or certain applications, a data flow that is too great can turn out to be disadvantageous, in particular because of the consumption involved in the management of this flow.

Conventional systems for compression of data implement an elimination of temporal redundancy in order to provide a compressed data stream to a display device. This is the case of the systems using for example an MPEG data flow. This type of encoding requires the use of a dedicated decoder, which can turn out to be itself a consumer of energy. This decoder generally constitutes a component distinct from the screen. Techniques based on the use of dictionaries of groups of pixels associated with entropy encoding, a decomposition into wavelets or combining a plurality of compression methods can also be used.

Moreover, there are display devices that are themselves capable of producing an image with a reduced resolution and allow the implementation of a compression.

A display device with line selectors modified and configured to allow to carry out a reduction in the display resolution is presented for example in the document U.S. Pat. No. 7,532,190B2. This device implements a reduction in resolution by simultaneously selecting a plurality of lines in order for these lines to receive the same pixel data. The reduction in resolution is carried out, along a vertical axis, uniformly.

As for the document WO201835045, it presents a device with a line and column selector adapted to implement 3 zones with different resolutions with a central zone with a higher resolution and regions with a lower resolution when progressively moving further away from the central zone. Various blocks of a column selector allow in particular to modify the resolution between 3 different resolutions according to a 2-bit code that is submitted to them, the zones of pixels controlled by the same block operating at the same resolution.

Such a device lacks a range of attainable resolutions as well as precision and flexibility with regard to the positioning of the zones with different resolutions with respect to each other.

The problem arises of finding a new display device which is improved with respect to the disadvantages mentioned above.

DESCRIPTION OF THE INVENTION

One embodiment of the present invention provides a device for displaying images comprising a matrix of pixels arranged by forming a plurality of lines and a plurality of columns of pixels, the display device comprising:
is a line selector, coupled with the lines of the matrix of pixels,
a column controller coupled with the columns of the matrix of pixels,
the line selector and/or the column controller comprising:
a selection circuit including a succession of output channels corresponding to various rows of said matrix of pixels, said selection circuit further comprising a succession of shift registers and a succession of switches controlled by at least one configuration word, each shift register being associated with an output channel of said selection circuit and with a switch of said succession of switches, a given output channel of said selection circuit being capable of being connected to an input of a shift register following the shift register with which the given output channel is associated, this given output channel being connected to an output of the shift register with which it is associated when the given switch with which this given output channel is associated is placed in a first configuration, the given output channel being connected to a preceding output channel of said succession of output channels when the given switch is placed in a second configuration, the display device further comprising:
a control stage, for controlling the respective configurations of the succession of switches of said selection circuit, the control stage being provided with at least one memory register for receiving at least one configuration word and being configured to place the switches of said succession of switches respectively in one of said first configuration or second configuration according to the respective states of bits of said configuration word, so that a configuration of a first switch depends on a value of a first bit of said configuration word, a configuration of a second switch depending on a value of a second bit of said configuration word.

In the first configuration, a signal is propagated which can be an activation signal or a piece of pixel data whereas in the second configuration the signal emitted on the preceding output channel is duplicated on the given output channel which allows to consequently duplicate on a row (vertical for a column or horizontal for a line) corresponding to the given output channel a piece of data intended for a row corresponding to the preceding output channel.

This duplication allows to form macropixels and to provide a reduction in the stream of pixel data presented at the input of the display device. A piece of data intended for a macropixel is presented once at the input of the display device and is automatically duplicated via this selection circuit by simultaneous selection of a plurality of lines and/or columns.

This device allows, using control via configuration word, to create groupings of lines and/or of columns, with both sizes and positions that can be modulated while being able to preserve very low resolutions and an improved precision of the positioning of borders between zones of different resolutions, this precision being able to be obtained give or take a pixel.

A first embodiment provides a display device in which said selection circuit belongs to the column controller, the column controller comprising a column selector provided with said selection circuit. In this first embodiment, an activation token is capable of being emitted at the input of said succession of registers and of propagating in this succession to sequentially activate an output channel or concomitantly a group of output channels connected to each other, the column controller further comprising, at the output of said column selector: a memory, said memory being configured to receive a sequence of data for controlling pixel display and being provided with a plurality of memory spaces each associated with one column out of said columns of the matrix, each memory space being itself associated with an output channel of said selection circuit which, when it is activated, causes, consecutively to the reception of a piece of data for controlling display at the input of the memory, a memorization of this piece of data in the memory space(s) respectively associated with the activated output channel(s).

According to a second embodiment of the display device in which said selection circuit belongs to the column controller, said selection circuit can be configured to receive data for controlling pixel display encoded over N bits (with N≥1), said given output channel of said succession of output channels being an output channel of a bit of a piece of data for controlling pixel display.

According to a specific embodiment of this second embodiment, the selection circuit can be configured to receive data for controlling pixel display encoded over N bits (with N>2), said selection circuit being configured so that a first bit of a piece of data for controlling pixel display is emitted over a first input of said selection circuit corresponding to an input of said succession of shift registers, said selection circuit further comprising, in parallel to said succession of shift registers, at least one second succession of shift registers, each shift register of said second succession being associated with an output channel for selection of a second succession of output channels and with a switch of a second succession of switches, said selection circuit being configured so that a second bit of a piece of data for controlling pixel display is emitted over a second input of said selection circuit corresponding to an input of said second succession of shift registers, said given output channel of said succession of output channels and another output channel of the second succession of output channels being channels for output respectively of a bit of a piece of data for controlling pixel display and of another bit of said same piece of data for controlling pixel display to a column of the matrix, said other output channel being associated with a switch of said second succession of switches controlled by the same configuration bit of said configuration word as said given switch.

According to an alternative of the display device for which said selection circuit belongs to the column controller, said stage for controlling configuration can be configured to receive at least one other configuration word.

The stage for controlling configuration can thus be provided with a series of logic gates, the respective outputs of which control the respective configurations of said switches of said succession of switches and so that the respective configurations of said switches are the result of a logical function, in particular an OR logical function, or a NAND logical function, between a configuration bit of said configuration word and a configuration bit of said other configuration word (CSW').

According to a specific embodiment of this alternative for which said selection circuit belongs to the column controller, the column controller comprising a column selector including a succession of selection outputs, the column selector being provided with said selection circuit, and wherein each output channel is associated with a switching block of a succession of switching blocks, each switching block being configured to alternatingly: when a given configuration bit of said other configuration word adopts a given value adopt a state in which its associated output channel is connected to a selection output of the column selector with which it is associated out of a succession of selection outputs and when said given configuration bit of said other configuration word adopts a complementary value of said given value adopt another state in which its associated output channel is disconnected from this selection output, said control stage being further configured to control the respective configurations of said switching blocks, via said other configuration word so that a value of a bit of said other configuration word determines a state of a first switching block while a value of another bit of said other configuration word determines a state of a second switching block.

According to another specific embodiment of this alternative, in which each offset register of said selection circuit is further associated with a switching element of a succession of switching elements, each switching element being configured to:

when a given bit of said other configuration word has, or adopts, a given value, adopt a first state in which the switching element connects the input of the shift register with which it is associated to the output of the shift register with which it is associated and to when the given bit of said other configuration word has, or adopts, a complementary value of said given value, adopt a second state in which the input of the shift register with which it is associated is disconnected from the output of the shift register with which it is associated, said control stage being configured to place said switching elements of said succession of switching elements in one of said first state or second state according to the respective states of bits of said other configuration word, so that a value of a bit of said other configuration word determines a state of a switching element of said succession of switching elements, a value of another configuration bit of said other configuration word determines a state of another switching element of said succession of switching elements.

A selection circuit is preferably also provided in the line selector. Thus, the display device can comprise a line selector provided with a second selection circuit including a series of output channels corresponding to various lines of the matrix, the second selection circuit being provided with a series of shift registers and with a series of switches controlled by at least one second configuration word, each shift register of the second selection circuit being associated with an output channel of said series of output channels and with a switch of said series of switches, the display device further comprising a second control stage provided with at least one other memory register for receiving said other configuration word, the second control stage being configured to control the respective configurations of the series of switches of the second selection circuit via said second configuration word.

According to another aspect, the present application relates to a process for managing data in a display device as defined above with in this order, comprising the steps of:
  reception of one or more configuration words respectively by one or more memory registers of said control stage and reception of said second configuration word by said other memory register of said second control stage,
  reception by said display device of data for controlling pixel display corresponding to a first image,
  reception of one or more new configuration words by said one or more registers of said control stage and reception of a new second configuration word, by said other register of said second control stage, the reception by the display device of data for controlling pixel display corresponding to a second image.

Alternatively, the process for managing data can comprise, in this order, the steps of:
  reception of one or more configuration words respectively by one or more memory registers of said control stage and reception of said second configuration word by said other memory register of said second control stage, reception by the display device of data for controlling pixel display corresponding to a first line of a first image, reception of one or more new configuration words by said one or more memory registers of said control stage, reception by the display device of data for controlling pixel display corresponding to a second line of the first image.

According to another aspect, the present application is aimed at a system for augmented reality or for virtual reality comprising a display device as defined above.

BRIEF DESCRIPTION OF THE DRAWINGS

The present invention will be better understood on the basis of the following description and the appended drawings in which.

Identical, similar or equivalent parts of the various drawings have the same numerical references so as to facilitate the passage from one drawing to the other.

The various parts shown in the figures are not necessarily shown according to a uniform scale, to make the drawings more readable.

DETAILED DESCRIPTION OF SPECIFIC EMBODIMENTS

Figure 1:
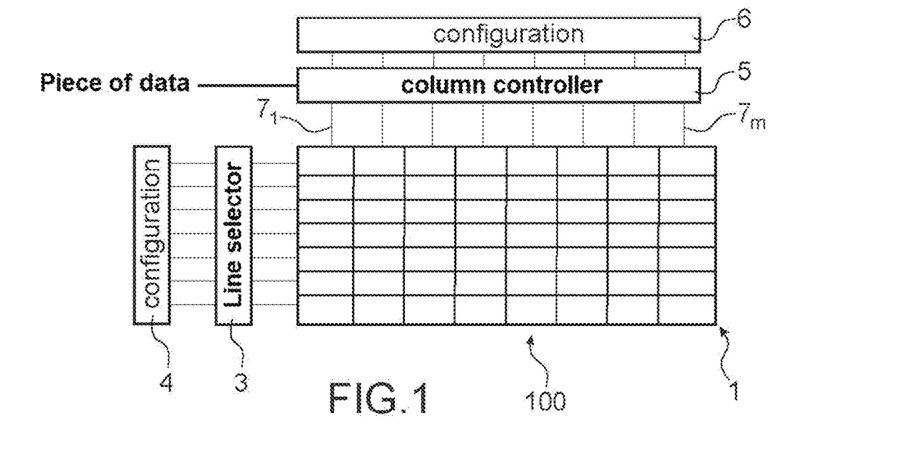
FIG. 1 is used to illustrate an example of architecture of a display device as implemented according to an embodiment of the present invention.

Reference is now made to FIG. 1 giving an example of an overall architecture of a display device as implemented according to an embodiment of the present invention.

This device is provided with a matrix 1 of pixels 2 and is in particular capable of displaying macropixels, in other words sets of neighboring pixels that receive the same piece of data for controlling display intended for one pixel, (this piece of data also being called "piece of pixel data") and onto which the same luminosity value is consequently imposed, in order to locally reduce the resolution of one or more zones of the image displayed, while preserving a finer resolution in other zones of the image.

When the display device is a color screen, a piece of pixel data contains a set of distinct luminosity values for each of the colors. Inside a macropixel these sets of values are identical from one pixel to the other.

The pixel data is typically transmitted to the matrix 1 line by line, while starting preferably with the pixel corresponding to the left upper corner of the matrix. The data corresponding to the same line is deserialized by a column controller 5 that is coupled with the columns (vertical rows) of the matrix 1 located on an edge of the matrix. The data corresponding to the same line (horizontal row) is communicated simultaneously to the pixels of the corresponding line.

At each transfer of pixel data between the column controller and the matrix of pixels, the pixel data is sent over buses $7_1, \ldots, 7_m$ connecting the pixels of the same column. A line selector 3 is configured to select the line of pixels for which the data is intended. In the case in which the outside data provided is of a digital nature, while the pixels forming the matrix have analogue control, the column controller 5 can contain a set of digital-to-analog converters allowing to modify the nature of the data.

Here, the grouping of pixels into macropixels has the particularity of being carried out using at least one digital configuration word formed by a set of bits called configuration bits, each of the configuration bits being able to determine the grouping of adjacent lines or columns to allow the latter to receive identical pixel data simultaneously.

Figure 2:
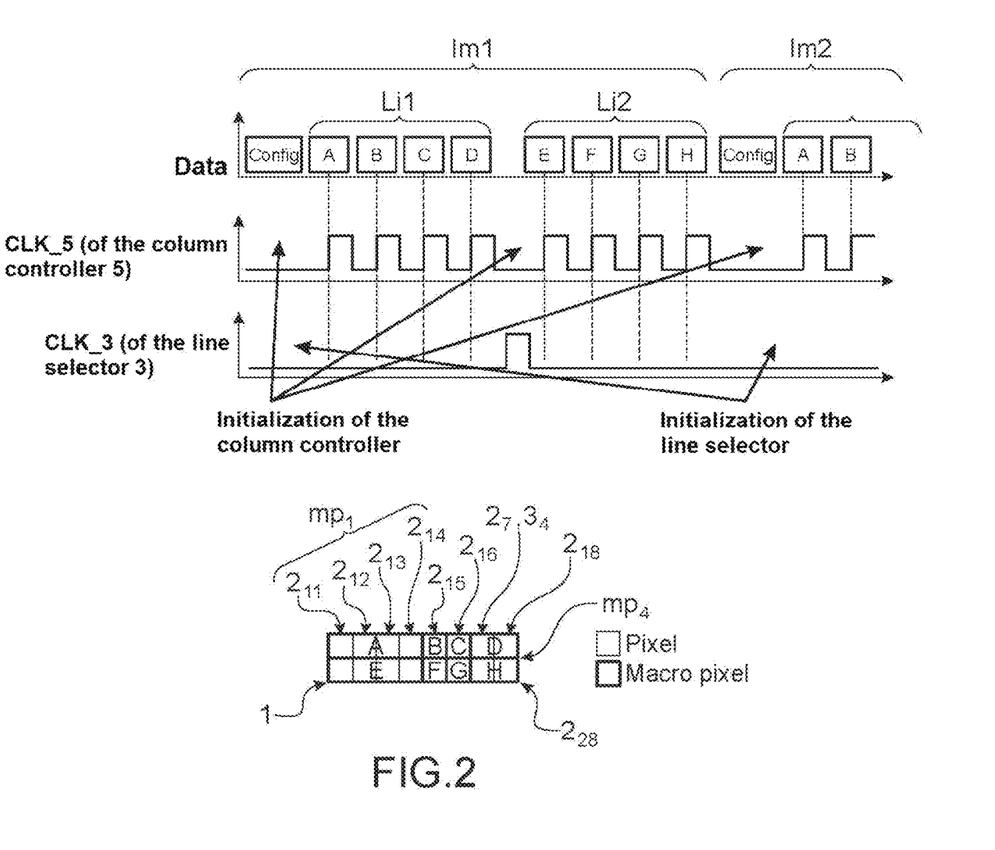
FIG. 2 is used to illustrate an example of a sequence of signals implemented for the display of an image formed by macropixels and capable of being displayed by a device as implemented according to an embodiment of the invention.

FIG. 2 is used to illustrate a grouping of pixels into macropixels by a display device implemented according to an embodiment of the present invention. The display device is in this example provided to display an image Im1 of 2 lines of 8 pixels $2_{11}, \ldots, 2_{18}, 2_{21}, \ldots, 2_{28}$.

First of all, at least one configuration word ("config" signal) is received in a register of a stage for controlling configuration of the column controller 5.

Then, data for controlling display of the pixels of a first line Li1, respectively having a value A, B, D, D is transmitted to the column controller 5 upon each clock strike (signal CLK_5) of this controller 5.

Because of the configuration word received by the stage for controlling configuration 6 associated with the column controller 5, the column controller adopts a configuration allowing it to duplicate a piece of data corresponding to a luminosity value A intended for the first pixel $2_{11}$ simultaneously over a plurality of columns and be able to display pixels $2_{11}$, $2_{12}$, $2_{13}$, $2_{14}$ having the same luminosity forming a macropixel $mp_1$. Data respectively containing the values B, C and corresponding to the pixels $2_{15}$, $2_{16}$ is not duplicated, while a following piece of data corresponding to a value D is duplicated in order to form a macropixel $mp_4$.

The line selector then selects (clock strike CLK_3) a second first line Li2, to which data having respective values E, F, G, H is transmitted sequentially.

In the exemplary embodiment of FIG. 2 a grouping by columns is carried out to form macropixels.

To carry out groupings by lines, the architecture presented in FIG. 1 can operate with a configuration word LSW loaded into a register of a stage 4 for controlling configuration coupled with the line selector 3.

Figure 3A:
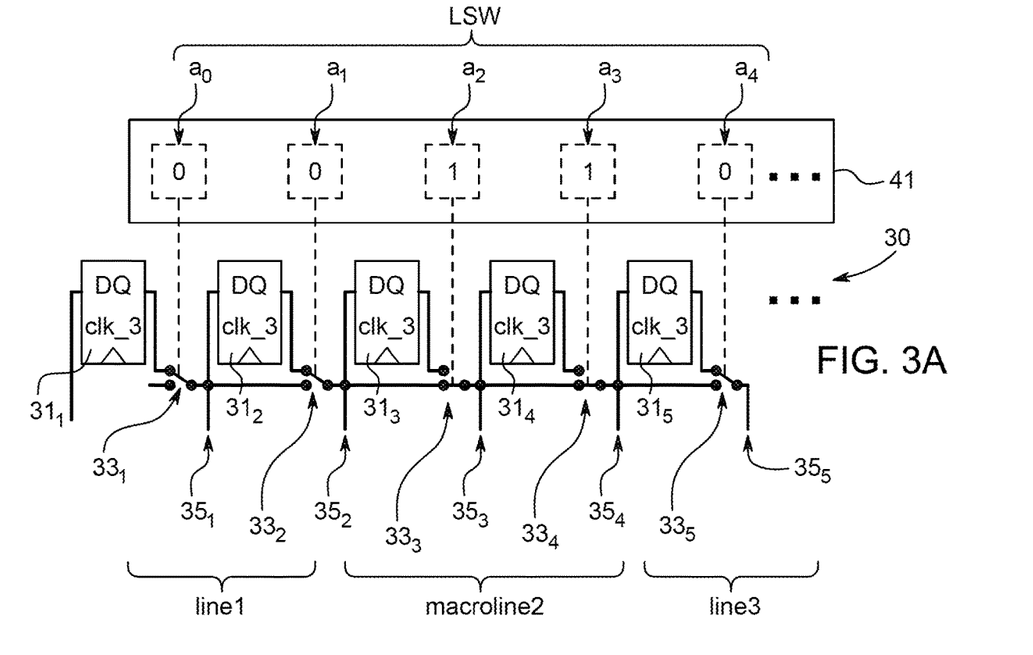
FIG. 3A is used to illustrate a specific exemplary embodiment of a line selector in a matrix display device as implemented according to an embodiment of the present invention.

To carry out a simultaneous selection of a plurality of lines in order to present the same piece of pixel data to pixels of different lines, the line selector can be provided with an architecture as illustrated in FIG. 3A.

Here, the line selector 3 is provided with a circuit block 30 comprising a succession of shift registers $31_1, \ldots, 31_k$, in particular 1-bit registers formed for example each by a D flip-flop and receiving the same clock signal CLK_3. Each of the registers $31_1, \ldots, 31_k$ is associated with an output channel of the block 30 out of a succession of output channels $35_1, \ldots, 35_1$.

Except for the first output channel $35_1$, each output channel $35_2, \ldots, 35_k$ of the block 30 is capable of being connected via a switch $33_2, \ldots, 33_k$, and according to the configuration of this switch, either to an output Q of the shift register $31_2, \ldots, 31_k$ that is associated with it, or to the preceding output channel in said succession of output channels $35_1, \ldots, 35_k$. The switches $33_2, \ldots, 33_k$ are typically formed each by a circuit with transistors. Except for the first register $31_1$, the input of each shift register $31_2, \ldots, 31_k$ is connected here to the output channel associated with the preceding register of the succession of registers.

The configuration of each of the switches of the block 30 is controlled individually by a bit $a_0, \ldots, a_{k-1}$ of a set of bits forming a line-selector configuration word LSW loaded into a configuration register 41 of the stage 4 for controlling configuration of the line selector 3.

In the exemplary embodiment illustrated, a bit $a_1$ provided to control the configuration of the switch $33_2$ associated with the output channel $35_2$ is set to a logical value for example '0'. This places the switch $33_2$ in a configuration in which the output channel $35_2$ is connected to the output Q of the shift register $31_2$ that is associated with this output channel $35_2$. The output channel $35_2$ connected to a non-inhibited output of the register $31_2$ thus occupies, during a cycle of the clock CLK_3, the state that the preceding output channel $35_1$ had during the preceding clock cycle. Such a configuration can allow the propagation of a signal for example for activation in the succession of registers.

Another bit $a_2$ provided to control the configuration of the switch $33_3$ associated with the output channel $35_3$ is set to a different logical value, here a '1', and allows to place the switch $33_3$ in a different configuration in which the output channel $35_3$ is connected this time to the preceding output channel $35_2$. In this other configuration, the register $31_3$ associated with the output channel $35_3$ this time has an output that is called "inhibited" and that can be left floating.

This output of the register $31_3$ is this time not connected to its associated output channel $35_3$. In this other configuration in which at least two output channels are connected to each other, a piece of pixel data can be duplicated on at least two different lines and thus form a macroline.

In the specific example illustrated in FIG. 3A, the configuration bits of the line-selector configuration word LSW allow to carry out a duplication of a piece of pixel data on 3 lines (macroline 2), by connecting the output channels $35_2$, $35_3$, $35_4$.

Such a device allows to obtain a flexible management of the resolution along a vertical axis of the image insofar as, besides the size of grouping of lines, the positioning of this or these groupings can be adjusted bit to bit by the configuration word LSW.

The activation of the lines or macrolines into which the pixel data is loaded can be carried out via an activation signal called "token" emitted at the input of the succession of registers $31_2, \ldots, 31_k$ and intended to propagate in the block 30, by following the principle of passing tokens.

The activation signal can be such that before an arrival of data intended for the first line of the matrix an activation '1' is for example presented at the input of the succession of registers $31_2, \ldots, 31_k$, while a '0' is presented for the other lines.

To carry out an activation of each new line of a compressed image, a clock cycle is received by the line selector 3.

According to the architecture of the display device illustrated in FIG. 1 it is advantageously possible to configure both the line selector 3 and the column controller 5.

Figure 3B:
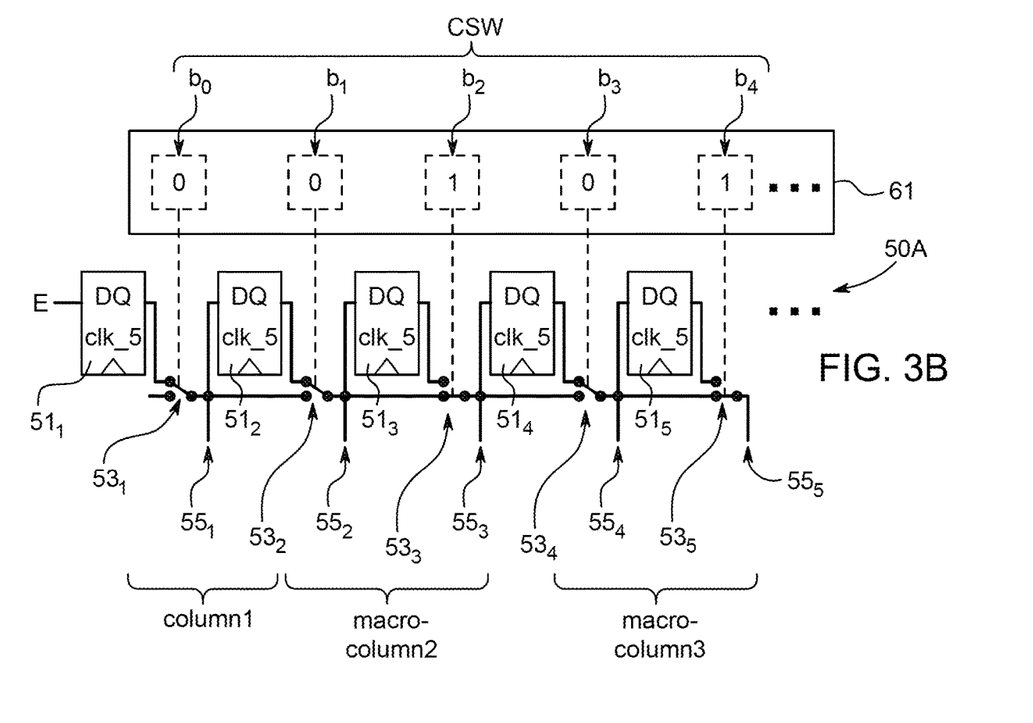
FIG. 3B is used to illustrate a specific exemplary embodiment of a column selector in a matrix display device as implemented according to an embodiment of the present invention.

With regard to the architecture of the column controller 5, it is possible to provide like in the embodiment illustrated in FIG. 3B a controller 5 provided with a column selector, the structure of which uses that of the line selector described above.

Thus, the column selector here is formed by a circuit block 50A comprising a succession of 1-bit shift registers $51_1, \ldots, 51_k$ each associated with an output channel of the block 50A out of a succession of output channels $55_1, \ldots, 55_k$ and each associated with a switch out of a succession of switches $53_1, \ldots, 53_k$. The 1-bit shift registers $51_1, \ldots, 51_k$ are this time controlled by a clock signal CLK_5 different than the clock signal allowing to set the cadence of the line selector.

The switches $53_1, \ldots, 53_k$ are also controlled one to one this time via a column-selector configuration word CSW loaded into a register 61 of a stage 6 for controlling configuration of the column controller and formed by bits $b_0, \ldots, b_{k-1}$.

In the exemplary embodiment illustrated, a bit $b_3$ for controlling configuration of the switch $53_4$ associated with the output channel $55_4$ is set to a given logical value, here a '0', so as to place the switch $53_4$ in a configuration in which it allows to connect the output channel $55_4$ to the output Q of the shift register $51_4$ that corresponds to this output channel.

Another bit $b_4$ for controlling configuration of the switch $53_5$ associated with the output channel $55_5$ is set to a complementary logical value of the given value, here a logical '1' that allows to place the switch $53_5$ in a different configuration in which it connects the output channel 55 to the preceding output channel $55_4$. This configuration in which the output channel $55_4$, $55_5$ allows to duplicate a piece of pixel data on two different columns and form a macrocolumn ("macrocolumn 3").

Such a device allows to obtain a flexible management of the resolution along a horizontal axis of the image insofar as, besides the size of grouping of columns, the positioning of this or these groupings can be adjusted bit to bit by the configuration word CSW.

In the specific exemplary embodiment of a column selector illustrated in FIG. 3B, like for the line selector, it is an activation signal that is emitted at the input E of the succession of registers $51_2, \ldots, 51_k$ and that is intended to propagate by following the principle of passing tokens and to be applied to one or more output channels.

Figure 4:
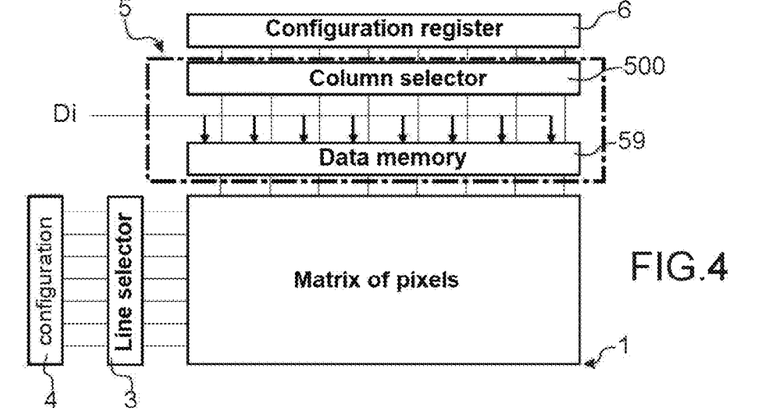
FIG. 4 is used to illustrate an example of a particular architecture of a display device in which the column selector is dissociated from a memory receiving the pixel data.

In this case, the column controller 5 can be provided with an architecture as illustrated schematically in FIG. 4, with a column selector 500 using the arrangement described previously in relation to FIG. 3B and the output channels of which are coupled with a memory 59 intended to receive pixel data. This memory 59 is formed by a set of memory spaces, each memory space being associated with a column out of the set of columns of the matrix 1. Each memory space is itself associated with an output channel out of the set of output channels $55_1, \ldots, 55_k$.

Each piece of pixel data Di presented at the input of the controller 5 is here presented at the input of all the memory spaces of the memory 59. Only the memory spaces selected by the column selector 500 memorize this piece of data Di. The selection of a memory space or of a plurality of memory spaces simultaneously results itself from the activation of an output channel (in other words from the reception by an output channel of an activation token) or of a plurality of output channels simultaneously out of the output channels of the selector 500. In this exemplary embodiment each output channel of the block 50A thus forms a selection output.

According to an alternative embodiment, provided in particular in the case in which the pixel data is transmitted in digital form, a column controller provided with a block 50B in which the functions of selection and of memorization are combined can be provided.

Figure 5:
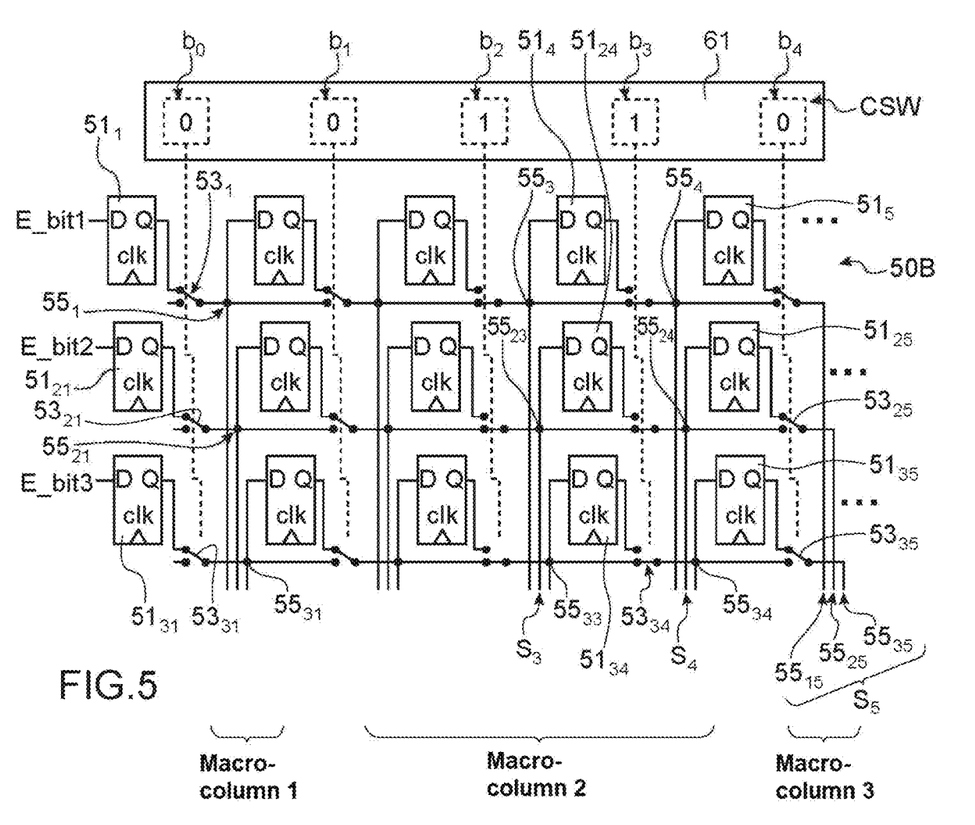
FIG. 5 is used to illustrate a specific exemplary embodiment of a column selector of a matrix display device as implemented according to an embodiment of the present invention and which is capable of directly receiving the pixel data.

An example of implementation of this type of column controller is illustrated in FIG. 5. It comprises a circuit 50B provided with a stage identical to the circuit 50A previously described in relation to FIG. 3B, and which is duplicated for each of the N bits (with N an integer that can be greater than 2) necessary for the encoding of a piece of pixel data.

In this case, each input of the circuit 50B no longer receives an activation signal in the form of a selection token but a bit of a piece of pixel data.

In the exemplary embodiment illustrated in which for example N=3 inputs are provided, in parallel to a first succession of 1-bit shift registers $51_1, \ldots, 51_k$, a second succession of shift registers $51_{21}, \ldots, 51_{2k}$, and a third succession of shift registers $51_{31}, \ldots, 51_{3k}$ are provided. In parallel to each output channel of the succession of channels $55_1, \ldots, 55_k$ N−1 other output channels are provided. In this example in which N=3, there are therefore respectively an output channel provided for a first bit of a piece of pixel data, an output channel for a second bit of this same piece of pixel data, and an output channel for a third bit of this same piece of pixel data. The output channels $55_1, 55_{21}, 55_{31} \ldots, 55_k, 55_{2k}, 55_{3k}$ form data outputs through which the pixel data comes to pass insofar as a bit of a piece of pixel data emitted at the input E_bit2 and intended for an output channel $55_{24}$ successively passes through all the output channels $55_{21}, 55_{22}, 55_{23}$ located between this input and the output channel $55_{24}$.

The succession of switches $53_{21}, \ldots, 53_{2k}$ at the output respectively of the shift registers $51_{21}, \ldots, 51_{2k}$ and the succession of switches $53_{31}, \ldots, 53_{3k}$ at the output respectively of the shift registers $51_{31}, \ldots, 51_{3k}$ is controlled by the same configuration word CSW as the succession of switches $53_1, \ldots, 53_k$.

Thus, in the example illustrated, a configuration bit $b_3$ of the word CSW set for example to a logical value '1' allows to place the switches $53_4, 53_{24}, 53_{34}$ in a configuration in which the respective outputs Q of the shift registers $51_4, 51_{24}, 51_{34}$ are inhibited. Thus, the output channels $55_4, 55_{24}, 55_{34}$ are respectively connected to the output channels $55_3, 55_{23}, 55_{33}$ preceding them in the succession of output channels, which allows to duplicate the bits of a piece of pixel data over a plurality of data outputs S3, S4 each corresponding to a column of pixels of the matrix.

The configuration words LSW, CSW intended to configure the line selector 3 and the column controller 5 can be transmitted to the display device by a specific channel distinct from that providing a video signal corresponding to a sequence of images. Alternatively, these configuration words can be incorporated into the video stream itself, for example in the form of metadata or in the form of "configuration pixels" integrated into the video stream. Such configuration pixels can be pixels added to the image, for example by adding a specific configuration line on the border, preferably upper, of an image to be displayed. A specific column on the lateral border of an image can also be provided. This specific line or specific column is not then displayed. Thus, fields of a video stream normally intended for the transmission of the data of colors of the pixels can be used to transmit the configuration words. This mode of transmission in which the configuration words take on a format similar to the pixel data allows to limit the number of additional components necessary for the management of the video signal.

In the case in which the sizes and positioning of the macropixels remain unchanged from one image to the other of a sequence of images, it is possible to not transmit the configuration word and thus only transmit these configuration words CSW, LSW when they are modified in order to redefine new positionings of the macropixels in a new image.

The two configuration words CSW, LSW can be transmitted to the registers 41, 61 before the sending of each image of a sequence of images. In this case, the same configuration word CSW is used for all the lines of an image, the compressed image transmitted thus including the same number of pixels for each of its lines. The compressed image (in other words corresponding to a compressed set of pixel data) transmitted to the display device thus preserves a "rectangular" appearance, insofar as all the lines correspond to the same number of pieces of pixel data, the same quantity of pixel data being sent during each line time.

Figure 6:
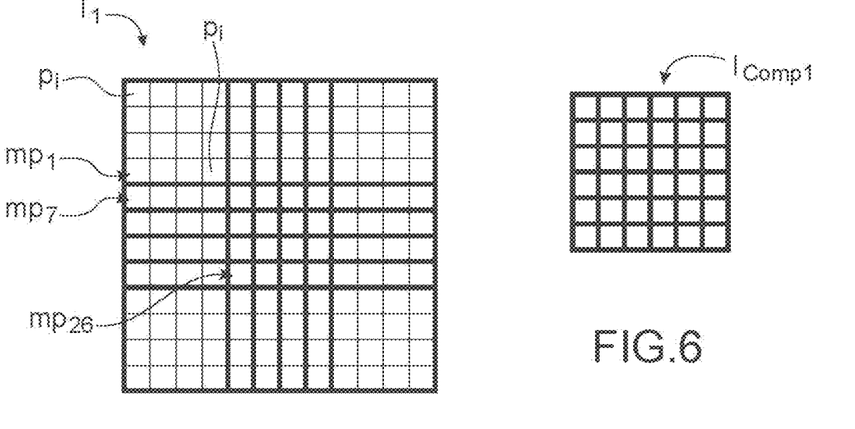
FIG. 6 is used to illustrate a first example of demarcation into macropixels by a display device according to an embodiment of the present invention so as to carry out a first type of data compression.

FIG. 6 illustrates an example of a displayed image h in which macropixels $mp_7, \ldots, mp_{26}, \ldots$ (defined by thick borders) are defined and correspond to groups of pixels $p_i$ (defined by thin borders) having the same value constructed from an compressed image $Icomp_1$ capable of being received by a display device as implemented according to the invention. In this case, the video stream received by the display device is close to a standard stream generally provided for the transmission of rectangular images. It is also possible to send a new configuration word LSW of the line selector 3 before each series of pixel data corresponding to a new image of a sequence of images and to send a new configuration word CSW for the column controller 5 before each series of pixel data corresponding to a new line of the image. This can require a transmission of a greater quantity of configuration words than in the example described above but can allow, for certain cases, to reach higher compression ratios by reducing the horizontal resolution above and below a zone of interest.

Figure 7:
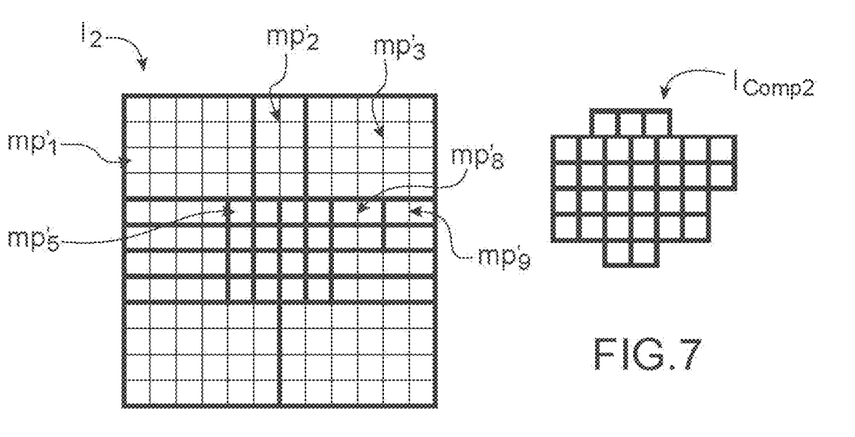
FIG. 7 is used to illustrate a second example of demarcation into macropixels by a display device according to another embodiment of the present invention so as to carry out a second type of data compression.

Such a mode of transmission of the configuration words can involve a compressed image Icomp$_2$ having a non-rectangular appearance (different quantity of pixel data sent during each line time) as illustrated for example in FIG. 7, leading to the display of an image I$_2$ formed by macropixels mp'$_2$, mp'$_3$ ..., mp'$_5$, mp'$_8$, mp'$_9$.

Advantageously, during the transmission of the configuration words LSW and CSW, it is possible to not transmit a bit corresponding to the first configuration bits a$_0$ and b$_0$ of these words and thus only transmit the following bits a$_1$ ... a$_k$ and b$_1$ ... b$_k$. The first bits a$_0$ and b$_0$ can indeed be set to a default value insofar as the first line or the first column does not result from a duplication of a preceding line or column.

Figure 8:
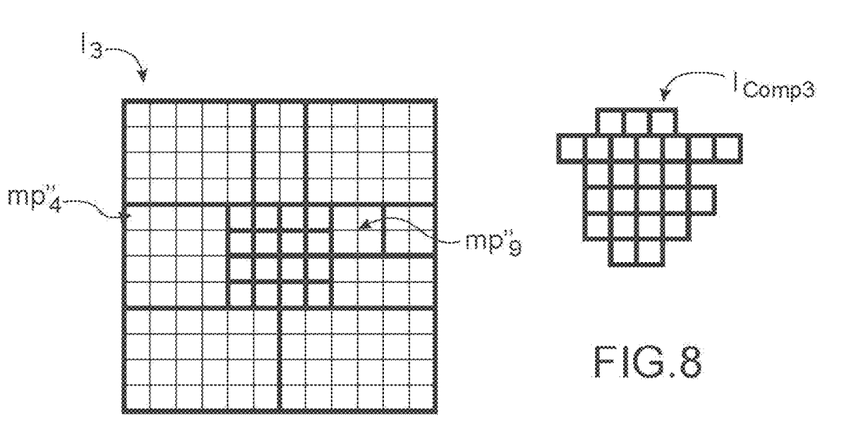
FIG. 8 is used to illustrate a third example of demarcation into macropixels by a display device according to another embodiment of the present invention so as to carry out a third type of data compression.

In the exemplary embodiments described above, the display of images with the same vertical resolution at any point of a line of the image is obtained. However, in certain cases, the vertical resolution thus imposed can turn out to be greater than necessary on either side of a zone of interest. FIG. 8 presents an image I3 that results from a compressed image Icomp3 including less pixels than the compressed image Icomp2 of the preceding example and in which the division into macropixels mp"4, mp"9 is such that the vertical resolution changes along a line of the image.

Figure 9:
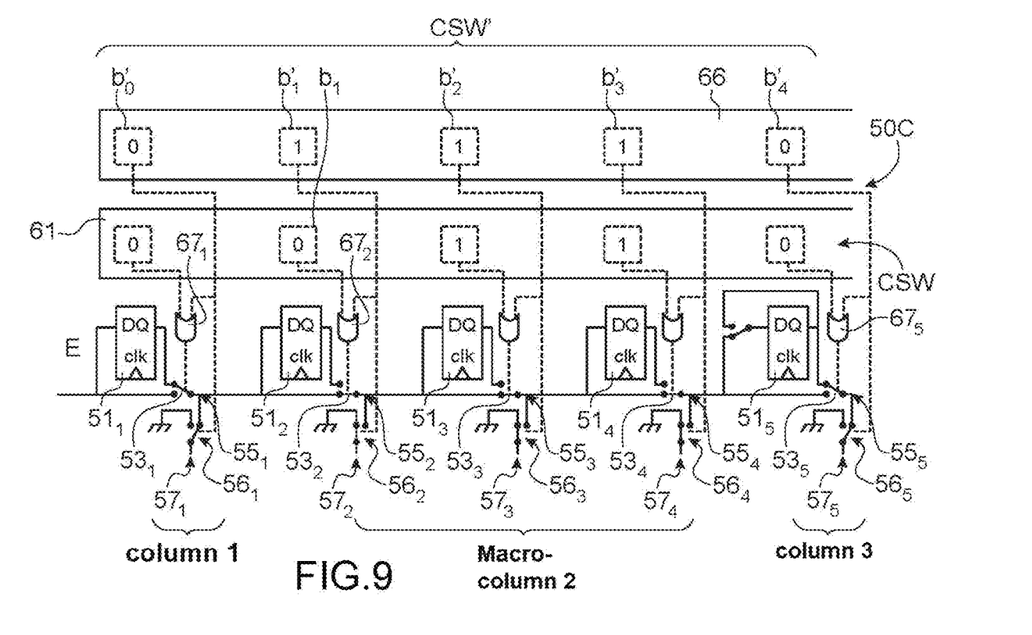
FIG. 9 is used to illustrate an example of a column selector of a display device according to an embodiment of the present invention and allowing to operate with a stream of pixel data that is more compressed and uses the third type of data compression.

Such a division can be implemented using another example of a column selector as illustrated in FIG. 9.

The selection block 50C shown adapts to an architecture such as that described above in relation to FIG. 4, in which the column selector is associated with a data memory and in which this column selector receives at the input an activation signal, in particular of the token type, while the pixel data is transmitted to a memory having an operation as described above and capable of memorizing pixel data to be transmitted to the matrix according to the activation signal.

In this circuit block 50C, which uses the succession of shift registers 51$_1$, ..., 51$_k$ and of switches 53$_1$, ..., 53$_k$, the configuration of the output channels 55$_1$, ..., 55$_k$ further depends this time on a second column configuration word CSW' introduced into a second register 66 of the stage 6 for controlling configuration.

Here, the output channels 55$_k$ are not directly coupled with the memorization elements of the memory receiving the pixel data. The circuit is this time coupled with the memory via selection outputs 57$_1$, ..., 57$_k$. The output channels 55$_1$, 55$_k$ are only capable of being coupled with the memory and of activating associated memorization elements when they are connected to a selection output itself coupled to the memory. Intermediate switching blocks 56$_k$ are thus provided to modify the arrangement between each output channel 55$_1$, 55$_k$ and its associated selection output 57$_1$, ..., 57$_k$. Like the switches 53$_1$, ..., 53$_k$, each switching block 56$_1$, ..., 56$_k$ can be formed for example by a circuit with transistors.

The new configuration word CSW' formed by bits b'$_0$ ... b'$_{k-1}$ allows to prevent a token moved by the column selector from activating selection outputs 57$_1$, ..., 57$_k$ corresponding to memory elements for which the content in terms of piece of pixel data must not be updated. In this way, it is not necessary to provide pixel data for columns corresponding to selection outputs deactivated by this second configuration word CSW', which can allow to reduce the quantity of pixel data necessary for the display and to thus carry out increased compression.

The switches 53$_1$, ..., 53$_k$ are in this example each controlled by the state of an output signal of a logic gate 67$_1$, ... 67$_k$ carrying out in this example an OR logical function. The configuration of a given switch is thus the result of an OR logical function between a configuration bit of the second configuration word CSW' and a configuration bit of the configuration word CSW. In the example illustrated, the bit b'$_1$=1 of the word CSW' and the b$_1$=0 of the word CSW set an output of the gate 67$_2$ to a logical value '1' allowing to place the switch 53$_2$ in a configuration in which the output channel 55$_2$ with which it is associated is connected to the preceding output channel 55$_1$. A complementary logical value, for example a logical '0', of the output of the gate 67$_2$ places the switch 53$_2$ in a different configuration, for which the output channel 55$_2$ is connected this time to the output Q of the register 51$_2$ associated with this output channel 55$_2$.

As for each switching block 56$_k$, it is configured to: according to the value of a configuration bit b'$_0$, ..., b'$_{k-1}$ of the second word CSW', alternatingly adopt either a first state in which this switching block connects an output channel 55$_1$, ..., 55$_k$ with which it is associated to a selection output 57$_1$, ..., 57$_k$ or a second state in which the output channel 55$_1$, ..., 55$_k$ is disconnected from the associated selection output 57$_1$, ..., 57$_k$, the latter thus not being able to transmit a signal to another stage of the column controller 5 and in particular an activation token to the memory 59.

A given value, in this example a logical '1', of a bit b'$_{k-2}$ of the second word CSW' places a switching block 56$_{k-1}$ in the second state, and the associated switch 53$_{k-1}$ in a configuration in which its associated output channel 55$_{k-1}$ is connected to a preceding output channel 55$_{k-2}$, while a complementary value (here a logical '0') of said given value of the same configuration bit b'$_{k-2}$ of the second word CSW' places the switching block 56$_{k-1}$ in the first state.

In the exemplary embodiment illustrated, the second configuration word CSW' allows to inhibit certain selection outputs 57$_2$, 57$_3$, and 57$_4$ by applying a logical '1' to the bits b'$_2$, b'$_3$ allowing to respectively control the switching blocks 56$_2$, 56$_3$ and 56$_4$. When an output is inhibited, an activation signal such as a token manifesting itself for example as a logical '1' is thus not communicated to the data memory 59.

Figure 10:
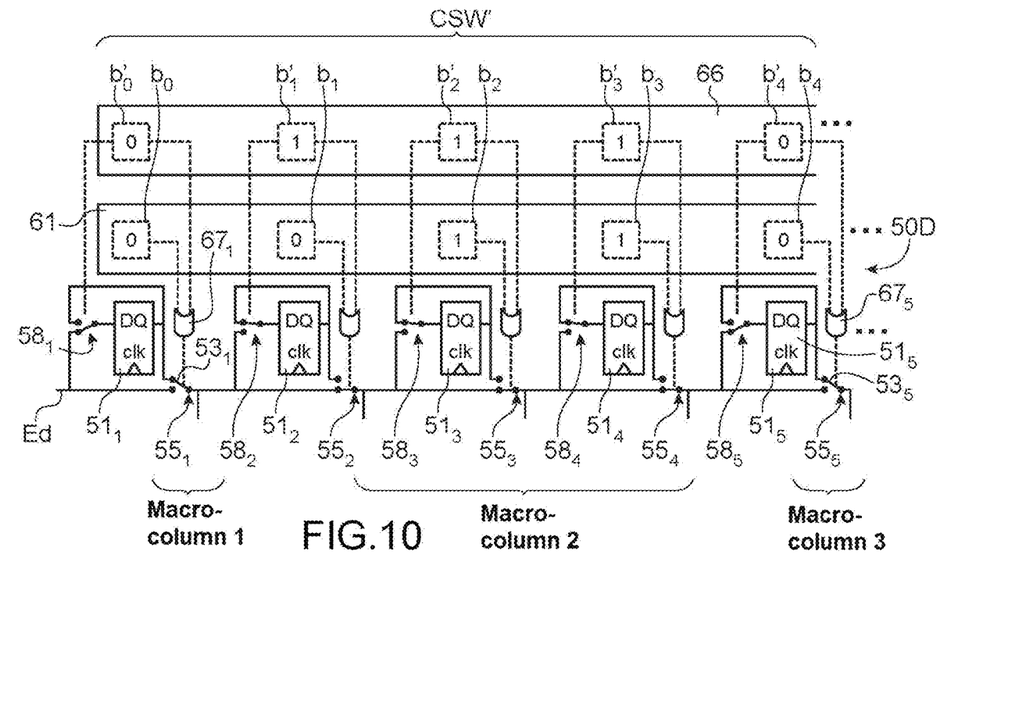
FIG. 10 is used to illustrate an alternative embodiment of the column selector which is capable of directly receiving the pixel data.

Although not shown in FIGS. 9 and 10, it is possible to have the case in which b'$_{k-1}$=0 and b$_{k-1}$=1, when a new piece of data is transmitted to a macropixel comprising at least two columns.

This configuration and that of the associated output channels 55$_2$, 55$_3$, and 55$_4$ allows a token at the input F to go directly in a single dock cycle to the output channel 55$_5$.

In the data memory, the memory elements corresponding to isolated outputs do not memorize a new piece of data, and can preserve a piece of pixel data used for a preceding macroline.

The second configuration word CSW' can be led to be modified for each new macroline to be displayed.

The exemplary embodiment of FIG. 9 provides control of the configuration of the switches 53$_1$, ..., 53$_k$ via an OR logical function. It is possible to carry out this control via other logical functions, for example its complementary logical function (NOR), or for example a NAND function or its complement (AND). The function used to obtain the desired behavior can depend on the chosen correspondence between the polarity of the configuration bits and the state of the various switches.

An alternative embodiment of the column selector described above and allowing to ensure a functionality similar to that of the given circuit in FIG. 9 is illustrated in FIG. 10.

It relates this time to a case in which pixel data is emitted at the input Ed of the column selector. In this example, the output channels $55_1, \ldots, 55_k$ of a selection-circuit block 50D thus form outputs of pixel data. The exemplary embodiment illustrated corresponds to pixel data encoded over 1 bit. In the case in which data is provided over a plurality of bits a plurality of circuits such as that shown are placed in parallel, each input and each output channel corresponding in this case to a bit of a piece of pixel data.

The selection-circuit block 50D illustrated uses the succession of shift registers $51_1, \ldots, 51_k$, of switches $53_1, \ldots, 53_k$, and the registers 61, 66, for storing respectively the first configuration word CSW and the second configuration word CSW' and the logic gates $67_1, \ldots, 67_k$ for controlling the switches $53_1, \ldots, 53_k$.

The switches $53_1$ are in this example also each controlled by the state of a signal at the output of a logic gate $67_1, \ldots 67_k$ carrying out in this example an OR logical function. The configuration of a given switch is thus the result of an OR logical function between a configuration bit of the second configuration word CSW' and a configuration bit of the configuration word CSW.

The bits of the second configuration word CSW' allow this time to control the state one to one of switching elements $58_1, \ldots, 58_k$ respectively associated with the shift registers $51_1, \ldots, 51_k$. The switching elements $58_1, \ldots, 58_k$ are for example each formed by a circuit with transistors. Each switching element $58_1, \ldots, 58_k$ is configured to, according to the value of a configuration bit of the second word CSW', alternatingly adopt a first state in which it connects an output Q of a register $51_1, \ldots, 51_k$ at the input of which it is located to an input D of this register, and a second state in which the output Q is this time disconnected from the input D. In this specific exemplary embodiment, a given value, in this example a logical '1', of a bit $b'_0$ of the second word CSW' places a switching element $58_1$ in the first state, while a complementary value (here a logical '0') of the same configuration bit $b'_0$ of the second word CSW' places the switching block $58_1$ in the second state.

When a switching element $58_k$ is in the second state, the input of the associated register can be, for the registers following the first register $51_1$, connected to a preceding output channel, that is to say associated with a preceding register, in particular when a switch $53_1, \ldots, 53_k$ associated with this preceding output channel is connected to the output of the preceding register.

A given value, in this example a logical '0', of a bit $b'_{k-2}$ of the second word CSW' places a switching block $58_{k-1}$ in the second state, while a complementary value (here a logical '1') of said given value of the same configuration bit $b'_{k-2}$ of the second word CSW' places the switching block $58_{k-1}$ in the first state.

Thus, in the exemplary embodiment illustrated, a switching element $58_2$ associated with a register $51_2$ is placed via a bit of the second configuration word CSW' in the first state. The input D of the shift register $51_2$ with which the switching element $58_2$ is associated being connected to the output Q of this same register $51_2$, this register $51_2$ thus preserving the same state at the output. A switching element $58_5$ associated with a shift register $51_5$ is placed via another bit $b'_1$ of the second configuration word CSW' in the second state. The input D of the shift register $51_5$ with which it is associated is connected to the output channel $55_4$ associated with the preceding shift register $51_4$.

The action of the bits of the second configuration word CSW' on the logic gates $67_1, \ldots, 67_k$ is preserved during the reception of the pixel data.

This action can be neutralized before a transfer of data from the column controller to the matrix of pixels.

In FIG. 10, the selection-circuit block 50D of the column controller is shown in a configuration corresponding to a phase of reception of data. In the specific configuration illustrated, the registers $51_1$ and $51_5$ allow to receive new data intended for macrocolumns 1 and 3, while the register $51_2$ preserves a piece of data already presented to a macrocolumn 2, for a preceding line of the matrix.

During a phase of transfer (not shown) of the data to the matrix, the switch $53_2$ is thus forced, in this example via a logical '0' on the bit $b_1$, into a state in which the output channel $55_2$ with which it is associated is connected at the output Q of the register $51_2$. The second configuration word CSW' is thus no longer used during this phase to control the switches $55_1, \ldots, 55_k$. The neutralization of the effect of the second configuration word CSW' thus allows the macrocolumn 2 to receive the piece of data that was preserved by the register $51_2$ during the phase of receiving the data. One way to neutralize the effect of the second configuration word CSW' is to impose the same logical value onto all the bits $b'_0, \ldots, b'_{k-1}$, in particular when the logic gates $67_1, \ldots 67_k$ are of the OR type, or to implement the function of neutralization in the logical function that controls the switches $55_1$-$55_k$ in order to control this neutralization by a single signal rather than by the modification of all the bits of CSW'.

Figure 11A:
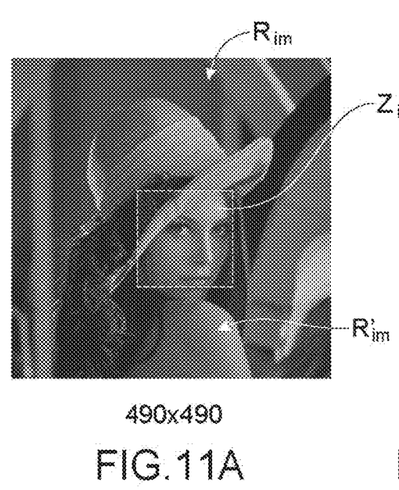
FIGS. 11A-11C are used to illustrate a compression of pixel data implemented via a display device according to the invention on an image including a zone of interest and regions of lesser interest.
Figure 11B:
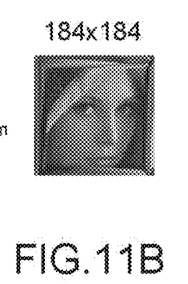
Figure 11C:
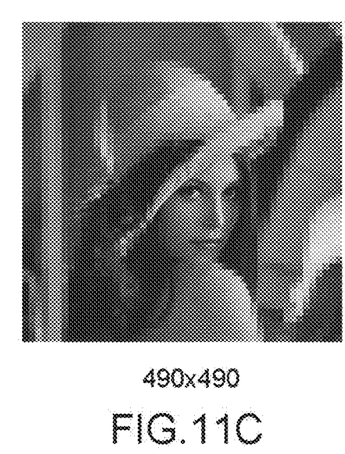

FIGS. 11A-11C illustrate a principle of compression decompression of images to be displayed by a screen as previously described.

These drawings respectively show: an image to be displayed comprising a zone of interest (FIG. 11A), an image (FIG. 11B) as transmitted to the display device implemented according to the invention and the pixels of which correspond to macropixels of an image intended to be displayed according to a division into macropixels as illustrated in FIG. 6, and a restored image (FIG. 13C) capable of being displayed by the screen of the display device as implemented according to the invention.

The image to be displayed includes a zone of interest Zi for which it is desired to preserve a greater resolution, in this example for which it is desired to preserve the initial resolution as well as one or more regions of lesser interest Rim, R'im. The regions Rim, R'im are provided with a lesser resolution for example divided by 10. In this specific example the display of an image having an initial resolution of 490×490 pixels only requires the transmission to the screen of a compressed image of 184×184 pixels, or approximately 7 times less pixel data. It is intended to add necessary configuration bits to this compressed image, in this example 490+490=980 bits to define the macropixels in the screen. If it is considered that a color of a pixel is encoded over 24 bits at a rate of 8 bits per Red, Green, Blue channel, the total quantity of data transmitted to the screen is 184×184×24+980=813 524 bits.

The transmission of the original image without compression would have required 490×490×24=5 762 400 bits, or approximately 7 times more. The presence of the configuration words in the totality of data to be processed is not significant and turns out to be negligible here in comparison to the quantity of data necessary for the description of the image to be displayed.

The display device can also have uses for example in an augmented-reality system in which a computer device provided with at least one processor superimposes in real time elements of 2D, 3D, video images onto real images.

The display device can also have uses in the virtual-reality systems in which a computer device provided with at least one processor generates in real time artificial 2D, 3D, video images.

Figure 12:
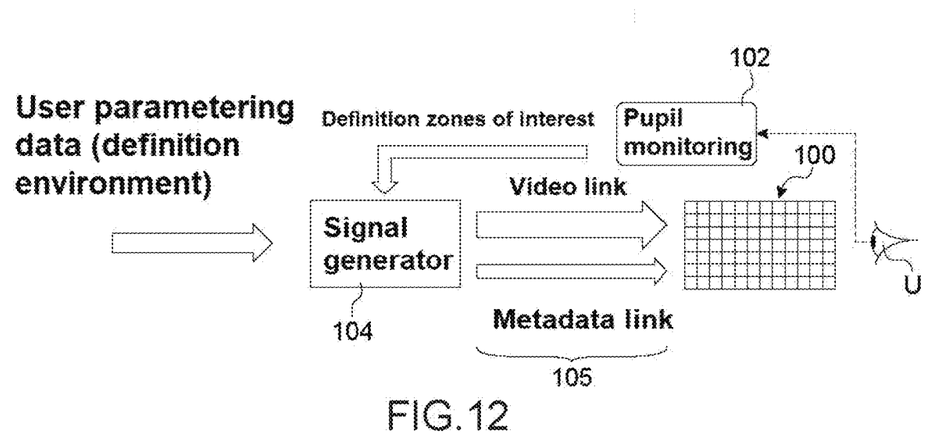
FIG. 12 is used to illustrate a method for determining the location of a zone of interest in an image that can be displayed with a display device as implemented according to the invention.

FIG. 12 schematically shows a computer system for virtual reality or for augmented reality using a variable-resolution display device 100 as described above.

This system provided with at least one data processor or with a computer includes a signal-generation block 104, the role of which is to generate an image intended to be displayed by a screen of the display device. This block 104 is capable of receiving parametering data allowing to define the environment that will be presented to a user U through the screen. This block 104 is also intended to receive data allowing to define one or more zones of interest on the screen in order to generate a compressed video signal allowing to display regions of lesser interest in lower resolution than the zone of interest. The block 104 can be created for example by an integrated circuit of the graphics processor (GPU) type programmed to generate the signal for controlling the screen from a digital description of a scene to be rendered and one or more zones of interest.

An image intended for the display device 100 can be generated in a conventional manner, then compressed in this signal-generation block 104 via a later processing step. It is also possible to provide a block 104 capable of natively generating an image in compressed form. This avoids generating a rendering in high definition in a region in which the resolution is led to be later degraded. The image-generation block 104 can be then transmitted to the screen in compressed form via a transmission link 105 ensuring both the transport of the video signal and of the configuration words. The exemplary embodiment illustrated in FIG. 12 provides a link 105 dedicated to the transport of only the video signal by using a separate link 106 for the routing of the configuration words. The data allowing to define the zones of interest of the screen can be extrapolated by the block 104 via an estimation of the interest of each portion of the rendered scene. It is possible to obtain this information via a system 102 for monitoring the pupils of a user U. The system 102 for monitoring the pupils can be for example a system as used for example in the document of Li and W. G. Wee, "An efficient method for eye tracking and eye-gazed FOV estimation" 2009 16th *IEEE International Conference on Image Processing* (*IC/P*), Cairo, 2009, pp. 2597-2600. doi: 10.1109/ICIP.2009.5413997.

This allows to define as a zone of interest a part of the screen on which the user U is focused.

It is also possible alternatively to provide a signal-generator block that only carries out a step of conversion, for example by itself receiving a video stream encoded in a conventional format and by generating the compressed signal and the configuration words expected by the variable-resolution screen.

The invention claimed is:

1. A display device for displaying images comprising a matrix of pixels arranged by forming a plurality of lines and a plurality of columns of pixels, the display device comprising:
   a line selector, coupled with the lines of the matrix of pixels,
   a column controller coupled with the columns of the matrix of pixels,
   the line selector and/or the column controller comprising:
      a selection circuit including
         a succession of output channels corresponding to various rows of said matrix of pixels,
         a succession of shift registers, and
         a succession of switches controlled by at least one configuration word,
      wherein
         each shift register is associated with an output channel of the succession of output channels and with a switch of said succession of switches,
         the output channels are coupled to a memory configured to receive pixel data for controlling pixel display or the output channels are coupled to the matrix of pixels and configured to receive the pixel data for controlling the pixel display,
         a given output channel of the succession of output channels is connected to an input of a shift register following the shift register with which the given output channel is associated,
         the given output channel being connected to an output of the shift register with which the given output channel is associated while being disconnected from a preceding output channel of the succession of output channels when a given switch with which the given output channel is associated is placed in a first configuration,
         the given output channel being connected to the preceding output channel of said succession of output channels while being disconnected from the output of the shift register with which the given output channel is associated when the given switch is placed in a second configuration,
      the second configuration enabling duplication, on the given output channel, of a signal provided on the preceding output channel in order to duplicate, on a row of the matrix corresponding to the given output channel, first pixel data of another row of the matrix corresponding to the preceding output channel,
      the display device further comprising:
         a control stage configured to control configurations of the succession of switches of said selection circuit, the control stage including at least one memory register for receiving the at least one configuration word, the control stage being configured to place the switches of said succession of switches respectively in one of said first configuration or second configuration according to bits of said at least one configuration word, so that a configuration of a first switch depends on a value of a first bit of said at least one configuration word, a configuration of a second switch depending on a value of a second bit of said at least one configuration word.

2. The display device according to claim 1, wherein said selection circuit is included in the column controller, the column controller comprising a column selector provided with said selection circuit, and
wherein an activation token is emitted at an input of said succession of shift registers, the activation token propagating through the succession of shift registers to sequentially activate one or more output channels,
the column controller further comprising, at the output of said column selector said memory provided with a plurality of memory spaces each associated with one column out of said columns of the matrix,
each memory space is associated with an output channel of said selection circuit, and when a respective output channel is activated, a piece of data for controlling display received by the memory is stored in the memory space respectively associated with the activated output channel.

3. The display device according to claim 1, wherein said selection circuit is included in the column controller, said selection circuit being configured to receive the pixel data for controlling pixel display encoded over N bits (with N≥1), said given output channel of said succession of output channels being an output channel of a bit of the pixel data for controlling pixel display.

4. The display device according to claim 3, wherein the selection circuit is configured to receive the pixel data for controlling pixel display encoded over N bits (with N>2), said selection circuit being configured so that a first bit of the pixel data for controlling pixel display is provided to a first input of said selection circuit corresponding to an input of said succession of shift registers,
said selection circuit further comprising, in parallel to said succession of shift registers, at least one second succession of shift registers, each shift register of said second succession being associated with an output channel of a second succession of output channels and being associated with a switch of a second succession of switches, said selection circuit being configured so that a second bit of the pixel data for controlling pixel display is provided to a second input of said selection circuit corresponding to an input of said second succession of shift registers,
said given output channel of said succession of output channels and another output channel of the second succession of output channels being channels for output respectively of a bit of the pixel data for controlling pixel display and of another bit of the pixel data for controlling display of said pixel to a column of the matrix, said other output channel being associated with a switch of said second succession of switches controlled by a same bit of said configuration word as said given switch.

5. The display device according to claim 1, wherein
said selection circuit is included in the column controller and wherein said control stage is configured to receive at least one other configuration word,
said control stage including a series of logic gates,
the respective outputs of the logic gates controlling the configurations of said switches of said succession of switches such that the configurations of said switches are based on an OR function or a NAND function applied to a bit of said configuration word and a bit of said other configuration word.

6. The display device according to claim 5, wherein
said selection circuit is included in the column controller,
the column controller comprising a column selector including a succession of selection outputs,
the column selector including said selection circuit, and wherein each output channel is associated with a switching block of a succession of switching blocks,
each switching block being configured to:
when a given configuration bit of said other configuration word adopts a given value, connect an output channel associated with the respective switching block to a selection output of the column selector with which the output channel is associated, and
when said given configuration bit of said other configuration word adopts a complementary value of said given value, disconnect the output channel associated with the respective switching block from the selection output,
said control stage being further configured to control configurations of said switching blocks via said other configuration word so that a value of a bit of said other configuration word determines a state of a first switching block while a value of another bit of said other configuration word determines a state of a second switching block.

7. The display device for displaying images according to claim 5, wherein each shift register of said selection circuit is further associated with a switching element of a succession of switching elements, each switching element being configured to:
when a given bit of said other configuration word adopts a given value, adopt a first state in which the switching element connects the input of the shift register with which the respective switching element is associated to the output of the shift register with which the respective switching element is associated, and
when the given bit of said other configuration word adopts a complementary value of said given value, adopt a second state in which the input of the shift register with which the respective switching element is associated is disconnected from the output of the shift register with which the respective switching element is associated,
said control stage being configured to place said switching elements of said succession of switching elements in one of said first state or the second state according to the bits of said other configuration word, so that a value of a bit of said other configuration word determines a state of a switching element of said succession of switching elements, and a value of another bit of said other configuration word determines a state of another switching element of said succession of switching elements.

8. The display device according to claim 1, wherein
said selection circuit is included in the column controller, and
wherein the line selector comprises a second selection circuit including a series of output channels corresponding to various lines of the matrix,
the second selection circuit including a series of shift registers and a series of switches controlled by at least one second configuration word,
each shift register of the second selection circuit being associated with an output channel of said series of output channels and being associated with a switch of said series of switches,
the display device further comprising a second control stage including at least one other memory register for receiving said at least one second configuration word, the second control stage being configured to control configurations of the series of switches of the second selection circuit via said second configuration word.

9. A method for managing data in the display device according to claim 8, comprising, in this order:
reception of the at least one configuration word by the at least one memory register of said control stage and reception of said at least one second configuration word by said other memory register of said second control stage,
reception, by said display device, of pixel data for controlling pixel display corresponding to a first image,
reception of one or more new configuration words by said at least one memory register of said control stage and reception of a new second configuration word, by said at least one other memory register of said second control stage, reception, by the display device, of pixel data for controlling pixel display corresponding to a second image.

10. A method for managing data in a display device according to claim 8, comprising, in this order:

reception of the at least one configuration word by the at least one memory register of said control stage and reception of said at least one second configuration word by said at least one other memory register of said second control stage, reception, by the display device, of pixel data for controlling pixel display corresponding to a first line of a first image, reception of one or more new configuration words by said at least one memory register of said control stage, reception, by the display device, of pixel data for controlling pixel display corresponding to a second line of the first image.

11. An augmented reality system or virtual reality system comprising the display device according to claim 1.

\* \* \* \* \*